United States Patent
Roth-Stielow et al.

(10) Patent No.: US 6,790,050 B1
(45) Date of Patent: Sep. 14, 2004

(54) DISTRIBUTION BOX

(75) Inventors: Jörg Roth-Stielow, Bretten (DE); Josef Schmidt, Graben-Neudorf (DE)

(73) Assignee: Sew Eurodrive GmbH & Co., Bruchsal (DE)

( * ) Notice: Subject to any disclaimer, the term of this patent is extended or adjusted under 35 U.S.C. 154(b) by 0 days.

(21) Appl. No.: 09/913,015

(22) PCT Filed: Feb. 9, 2000

(86) PCT No.: PCT/EP00/01034

§ 371 (c)(1),
(2), (4) Date: Aug. 8, 2001

(87) PCT Pub. No.: WO00/48438

PCT Pub. Date: Aug. 17, 2000

(30) Foreign Application Priority Data

Feb. 12, 1999 (DE) .......................... 199 05 952

(51) Int. Cl.[7] .............................................. H01R 12/00
(52) U.S. Cl. ...................... 439/76.2; 439/949; 361/752
(58) Field of Search ............................. 439/76.2, 76.1, 439/949, 65, 74; 361/752

(56) References Cited

U.S. PATENT DOCUMENTS

| | | | |
|---|---|---|---|
| 6,010,341 A | * | 1/2000 | Matsuoka .................. 439/76.2 |
| 6,210,179 B1 | | 4/2001 | Lausberg et al. |
| 6,218,740 B1 | * | 4/2001 | Mildice ...................... 307/10.1 |
| 6,291,770 B1 | * | 9/2001 | Casperson ................ 174/72 A |
| 6,466,447 B2 | * | 10/2002 | Murowaki et al. ........... 361/752 |
| 6,634,892 B2 | * | 10/2003 | Nakamura .................. 439/76.2 |
| 6,683,950 B1 | * | 1/2004 | Harwood et al. ....... 379/413.02 |
| 6,690,582 B2 | * | 2/2004 | Sumida ........................ 361/752 |
| 6,707,689 B2 | * | 3/2004 | Momota et al. ............. 361/833 |
| 6,712,623 B2 | * | 3/2004 | Sumida ...................... 439/76.2 |

FOREIGN PATENT DOCUMENTS

| | | |
|---|---|---|
| DE | 40 05 086 A | 8/1991 |
| DE | 44 37 316 A | 4/1996 |
| DE | 196 16 551 A | 10/1997 |
| DE | 197 30 788 A | 4/1998 |
| DE | 198 16 170 A | 10/1999 |

* cited by examiner

Primary Examiner—Gary Paumen
(74) Attorney, Agent, or Firm—Merchant & Gould P.C.

(57) ABSTRACT

A distributor box is provided for microprocessor, memory and logic components and/or power semiconductor components, with a housing comprising a lower housing compartment and at least one upper housing compartment, which can be connected to the lower compartment in a tightly sealed, firm manner to provide a high degree of protection. At least one transfer pin-and-socket connector is provided comprising a first and a second connector part, the first connector part of which is fixedly mounted in an upper housing compartment in such a way that when this upper compartment is set onto the lower compartment, the first connector part is brought into electrical contact with a second connector part of the transfer pin-and-socket connector, which fits together with the first part and is fixedly mounted in the lower housing compartment. In the lower housing compartment are mounted connecting devices or external terminal arrangements such as terminal strips or the like, so that a set of cables can be connected to at least the associated second pin-and-socket connector part. The lower housing compartment comprises a T-shaped, high tension cabling between two external connecting devices and one external terminal arrangement for a hybrid cable on the lower housing compartment. The lower housing compartment also comprises a T-shaped cabling for a field bus between two external terminal arrangements on the lower housing compartment and at least one second pin-and-socket connector part. In at least one upper housing compartment there is mounted an electronic circuit that can be electrically connected to a control bus by way of a first and a second pin-and-socket connector part. The lower housing compartment also comprises an external means of connecting a hybrid cable with hybrid pin-and-socket connector part that incorporates high tension and low tension leads, the high tension leads being connectable to at least one electronic circuit in an upper housing compartment.

23 Claims, 6 Drawing Sheets

DISTRIBUTION BOX

FIELD OF THE INVENTION

The invention relates to a distributor box.

DESCRIPTION OF THE PRIOR ART

In industrial plants many widely scattered items of field equipment, in particular drive mechanisms, consisting of electric motors with frequency or voltage converters or switching devices, must be controllable from a central computer. For this purpose various types of field buses are used, such as the Interbus, Profibus, CANbus or the like. The field equipment is provided with leads suitable for a field bus and usually each mechanism includes an addressable electronic control unit that filters data out of the field-bus signals when those data are addressed to the particular mechanism concerned.

Energy or power is supplied to the field equipment by way of high tension cables, in particular those designed for three-phase current.

In many cases the manufacturers of field equipment make use of other control-bus protocols, which are not in the same category as field buses. For example, those skilled in the art will be familiar with the control-bus protocol MOVILINK, made by the firm SEW-EURODRIVE GmbH & Co. These control-bus protocols are not compatible with the field-bus protocols conventionally used in industry and are also termed system-bus protocols. They can exhibit an extremely high data-transfer rate. In particular, with such control or system buses the commands and codings are designed specifically for a certain group of devices, and in particular depend on the individual manufacturer. On the whole, with system buses the real-time performance of applications can be improved.

The set of cables used for high voltage and bus systems is elaborate and expensive, in particular because of the stellate cable arrangement of the high tension wiring. One substantial cost factor is the time needed to install the cabling.

DE 40 05 086 discloses a terminal unit for domestic technology. The housing of this unit provides a separation between electronic circuitry and cabling. Here the cabling is mounted in the lower part of the unit and the electronic circuitry, in the upper part of the unit. This terminal unit cannot be used for industrial plants.

The objective of the invention is to provide a distributor box which avoids the above-mentioned disadvantages. In particular, it is intended to enable simple and inexpensive cabling.

SUMMARY OF THE INVENTION

Essential features of this solution of the problem are that the distributor box with at least one electronic circuit, in particular comprising microprocessor, memory and logic components and/or power semiconductor components, with a housing, comprises a lower housing compartment, at least one upper housing compartment, which can be connected to the lower compartment in a tightly sealed, firm manner to provide a high degree of protection, at least one transfer pin-and-socket connector, each of which comprises a first and a second connector part, the first connector part of which is fixedly mounted in an upper housing compartment in such a way that when this upper compartment is set onto the lower compartment, the first connector part is brought into electrical contact with a second connector part of the transfer pin-and-socket connector, which fits together with the first part and is fixedly mounted in the lower housing compartment, wherein in the lower housing compartment are mounted connecting devices or external terminal arrangements such as terminal strips or the like, so that a set of cables can be connected to at least the associated second pin-and-socket connector part, and wherein the lower housing compartment comprises a T-shaped, high tension cabling, such as for a three-phase current, between two external connecting devices and one external terminal arrangement for a hybrid cable on the lower housing compartment, and wherein the lower housing compartment comprises a T-shaped cabling for a field bus between two external terminal arrangements on the lower housing compartment and at least one second pin-and-socket connector part, and wherein in at least one upper housing compartment there is mounted an electronic circuit that can be electrically connected to a control bus by way of a first and a second pin-and-socket connector part, and wherein the lower housing compartment comprises an external means of connecting a hybrid cable with hybrid pin-and-socket connector part that incorporates high tension and low tension leads, and wherein the high tension leads of the hybrid cable can be connected to at least one electronic circuit in an upper housing compartment.

Hence it advantageously enables the cabling arrangement to be very simple and inexpensive. In particular, parts can be preassembled and prefabricated, and thus need not be handled individually during installation in the plant. The transfer pin-and-socket connector and connector parts enable a particularly rapid, secure and simple connection of housing compartments. In particular, the use of hybrid pin-and-socket connector parts also makes it possible to close and disconnect high tension and low tension leads in a time-saving manner. The provision of the hybrid cable saves time and furthermore makes the layout of the whole cabling system clearer, because high tension and low tension cables no longer need to be positioned individually.

An especially crucial characteristic of the invention is that the leads of the field bus are looped through and therefore advantageously make possible annular structures of the cabling for field buses. A similar essential characteristic of the invention is that the high tension cabling is T-shaped and the branch to the associated field mechanism is enabled by a hybrid cable. Hence it is possible to use annular cabling for the high voltage as well. Here it is of advantage that such cablings can be implemented in a distinctly more economical way, with a saving of materials.

The term "field mechanism" is understood here to include an electric motor with converter, an electric motor with a simple switching device to turn it on and off, an electric motor with smooth-starting device or the like.

The term "looped through" indicates that a cable coming from the exterior is connected by leads to an external terminal arrangement in the distributor box and then, by way of internal cabling, is connected to an additional external terminal arrangement in the distributor box to which, in turn, a cable coming from the exterior is connected by leads.

The term "T-shaped cabling" should be understood to mean that a cable coming from the exterior is connected by leads to an external terminal arrangement in the distributor box and then, by way of an internal cabling, is electrically connected to at least two additional external terminal arrangements in the distributor box, to which in turn cables coming from the exterior can be connected by leads. One of these external terminal arrangements is designed for a hybrid cable that comprises high tension and control-bus leads.

Another particularly essential characteristic of the invention consists in the fact that cable systems and connectors are fixedly mounted in the lower housing compartment, so as to be immune to interference, whereas the electronic apparatus that requires maintenance or repair, or needs to be adjusted or replaced to suit the local conditions, is disposed in the upper housing compartment. This separation makes it possible to carry out extremely complicated maintenance work even under adverse field conditions, by merely exchanging one upper housing compartment for another one with electronics that are undamaged or suited to the altered conditions or requirements. An added benefit is that the degree of protection can be of a high standard, which is likewise facilitated in particular by the mechanical and electrical separation between the upper and lower compartments.

Altogether, then, the distributor box comprises at least one electronic circuit, in particular one with microprocessor, memory and logic circuitry, and a housing with a lower compartment and at least one upper compartment, which can be connected thereto in a tightly sealed and stable manner and includes a transfer pin-and-socket connector, the first part of which is fixedly mounted on the upper housing compartment in such a way that when an upper housing compartment is put into place on the lower housing compartment, it is brought into electrical contact with a second connector part of the transfer pin-and-socket connector that is fixedly mounted in the lower housing compartment. In this arrangement, external terminal arrangements such as terminal strips or the like are disposed in the lower housing compartment, in order to connect a cable arrangement to the second pin-and-socket connector part, and in the upper housing compartment the electronic circuitry is disposed.

The low tension leads comprise, on one hand, preferably braking leads to control an electric motor with brake, in which case the braking leads can be connected to the particular electronic circuitry that comprises a converter and can be connected to at least control-bus leads; on the other hand, they comprise control-bus leads, in which case the control-bus leads of the hybrid cable can be connected to the control-bus leads of the particular electronic circuitry that is electrically connected to the field bus. It is advantageous here that in both cases the same type of hybrid cable can be used, so that there is a net reduction of expenditure.

Preferably the transfer pin-and-socket connector provides the only electrical connection between the cabling in the lower housing compartment and the electronic circuitry in each upper compartment. Therefore the electronics can be repaired or exchanged by simply exchanging one upper housing compartment for another, with minimal manipulation, as the upper housing compartments with incorporated electronics have been constructed or reconstructed in suitable surroundings, i.e. not in the field.

In another preferable embodiment, the distributor box comprises a ground-connection cable between each upper housing compartment and the lower compartment. Hence the transfer pin-and-socket connectors and the ground-connection cable constitute the only electrical connection between the upper and lower housing compartments. It is advantageous here that the upper housing compartment is grounded even after it has been opened or lifted off.

The field-bus leads, as low tension leads, in an advantageous embodiment also comprise leads for power supply, such as 24-V leads or the like. Shielding and grounding leads can also be included. It is advantageous here that the field-bus leads with power-supply leads are distinguished from the high tension cabling systems and can be cabled together with the field-bus leads.

In a further development the lower housing compartment comprises a motor-protection switch. It is advantageous here that for purposes of assembly, repair or installation it is possible to interrupt the high voltage supply to the field mechanism or mechanisms supplied from the distributor box.

In an advantageous further development the lower housing compartment comprises an auxiliary switch that is mechanically coupled to the motor-protection switch. The motor-protection switch electrically disconnects the high tension leads. The auxiliary switch, because of the mechanical coupling, approximately simultaneously electrically disconnects the field-bus leads and the power-supply leads. It is advantageous here that the field mechanism or mechanisms can be completely disconnected electrically.

In an advantageous embodiment the electronic circuitry is configured so as to be addressable as a bus participant and the data destined for this address can be filtered out from the field bus and translated into a control-bus protocol, and the translated data can be sent on by way of the control bus to the one or more items of field apparatus supplied by the distributor box.

In another preferred embodiment a first upper housing compartment incorporates an electronic circuit that is electrically connected at least to the field bus and the system bus. It is advantageous here that the electronic circuit can be designed as a bus converter and can be rapidly exchanged by means of the above-mentioned pin-and-socket connector parts. Hence it is even possible to change from one bus system to another by exchanging this upper housing component, with its electronic circuit.

In another preferred embodiment the distributor box comprises a second upper housing compartment to form a closed-off spatial region. It is advantageous here that by lifting up the housing compartment the space containing the external terminal arrangements becomes accessible and necessary cable installations can be carried out. Once this cabling work has been completed, the upper housing compartment is replaced and hence the housing advantageously again becomes tightly sealed and firmly reconnected, i.e. is closed with a high degree of protection.

In yet another preferred embodiment the distributor box comprises a third upper housing compartment with an electronic circuit that can be connected electrically to at least the system bus and brake leads. It is advantageous here that the electronic circuit can be designed as a converter and hence the distributor box can supply, control and regulate an electric motor.

In another preferred embodiment the lower housing compartment comprises a braking resistance of a converter and the braking resistance is electrically connected to the electronic circuit of the third upper housing compartment. It is advantageous here that a braking resistance can be integrated into the distributor box and the housing of the distributor box can actually be used to conduct heat away from the braking resistance. Hence the housing simultaneously serves as a cooling device.

In another distributor box an essential characteristic is that the distributor box with at least one electronic circuit, in particular comprising microprocessor, memory and logic components and/or power semiconductor elements, with a housing, comprises a lower housing compartment, at least one upper housing compartment that can be connected to the lower housing compartment in a tightly sealed and stable manner, i.e. with a high degree of protection, at least one transfer pin-and-socket connector, each of which comprises a first and a second connector part, the first connector part of which is mounted in an upper housing compartment in such a way that when this upper housing compartment is put into place on the lower housing compartment the first connector part can be brought into electrical contact with a second connector part of the transfer pin-and-socket connector, which fits together with the first part and is mounted in the lower housing compartment, wherein in the lower housing compartment connecting devices and/or external terminal arrangements such as terminal strips or the like are mounted by which to connect a set of cables to at least the second pin-and-socket connector part in each case, wherein the housing is in thermally conducting connection with a braking resistance of a converter.

It is advantageous here that a braking resistance can be integrated into the distributor box and the housing of the distributor box can actually be used to conduct heat away from the braking resistance. The housing thus simultaneously serves as a cooling device. Hence the braking resistance can be installed during manufacture, eliminating costs for installation, assembly, cabling or the like. Furthermore, there is no need to provide extra room for mounting the braking resistance.

In another preferred embodiment the braking resistance is mounted in the interior of the housing. It is advantageous here that the housing takes over protective functions, such as shielding people from high temperatures and protection against contact in general. Furthermore, the housing can be electrically grounded and hence provides electrical protection. In another preferred embodiment the housing is made of plastic. It is advantageous here that even an insulating function can additionally be served by the housing.

In another preferred embodiment the housing is constructed so as to give off heat, in particular comprises cooling fingers and/or cooling ribs. It is advantageous here that the housing of the distributor box can rapidly give off thermal energy into the surroundings; that is, it has a low heat-transfer resistance with respect to the surroundings.

In another distributor box an essential characteristic is that the distributor box with at least one electronic circuit, in particular comprising microprocessor, memory and logic components and/or power semiconductor elements, with a housing, comprises a lower housing compartment, at least one upper housing compartment that can be connected to the lower housing compartment in a tightly sealed and stable manner, i.e. with a high degree of protection, at least one transfer pin-and-socket connector, each of which comprises a first and a second connector part and the first connector part of which is mounted in an upper housing compartment in such a way that when this upper housing compartment is put into place on the lower housing compartment the first connector part can be brought into electrical contact with a second connector part of the transfer pin-and-socket connector, which fits together with the first part and is mounted in the lower housing compartment, wherein in the lower housing compartment connecting devices and/or external terminal arrangements such as terminal strips or the like are mounted by which to connect a set of cables to at least the second pin-and-socket connector part in each case, wherein a second upper housing compartment together with at least the lower housing compartment closes off from the surroundings or makes accessible an interior spatial region of the housing of the distributor box, so that the connecting devices and/or the external terminal arrangements are accessible for connecting the cabling.

It is advantageous here that for connecting the cabling, for example during installation, maintenance or putting the system into operation, the connecting devices and/or the external terminal arrangements are made accessible and can be altered by releasing the second upper housing compartment.

In another preferred embodiment the second upper housing compartment is the only part that must be released from the lower housing component in order to make the connecting devices and/or the external connector devices accessible in order to connect the cabling.

It is advantageous here that only one part needs to be released, for instance unscrewed. This saves time and hence also costs associated with maintenance, assembly and installation.

Preferred embodiments of the invention will be apparent from the subordinate claims.

The invention is explained in greater detail with reference to the drawings.

DESCRIPTION OF THE PREFERRED EMBODIMENTS

Figure 1:
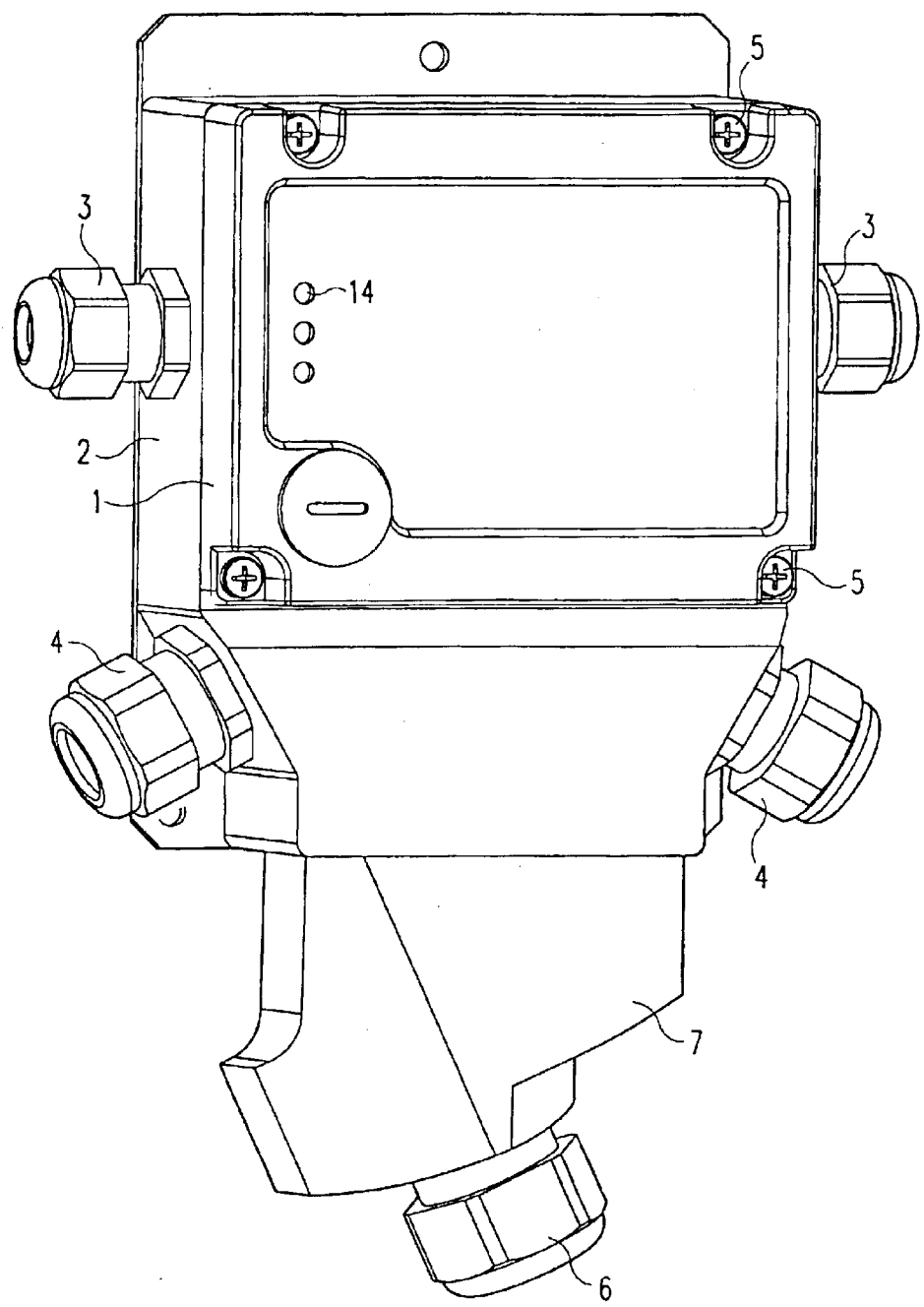
FIG. 1 is a perspective view of a first exemplary embodiment of the invention.

In FIG. 1 an embodiment of the distributor box in accordance with the invention is shown. It comprises a lower housing compartment 2 and an upper housing compartment 1. Field-bus cables with field-bus leads and power-supply leads pass through the PG screw fittings 3 and apertures in the housing wall into the interior of the lower housing compartment 2. Similarly, high tension cables pass through PG screw fittings 4 into the interior of the lower housing compartment 2. The upper housing compartment 1 is fixedly attached to the lower housing compartment by means of releasable screws 5. A sealing element is inserted between the adjacent surfaces of the upper housing compartment 1 and lower housing compartment 2, so that the two compartments are joined together with a high degree of protection. The electrical connection between upper housing compartment 1 and lower housing compartment 2 is accomplished by means of two pin-and-socket connector parts, which are not shown in the figure.

A hybrid cable coming from the field mechanism or mechanisms is led through the PG screw fitting 6 and connected to a commercially available hybrid pin-and-socket connector part 7. This is inserted into a corresponding hybrid pin-and-socket connector part as external terminal arrangements of the lower housing compartment 2; the latter hybrid pin-and-socket connector part is soldered to a board 24 (see FIG. 2) in the lower housing compartment 2 and hence integrated into the lower housing compartment 2.

The upper housing compartment 1 comprises an electronic circuit that is electrically connected to the field-bus leads and to leads of the hybrid cable. A central computer and, in some cases, other field mechanisms are thus electrically connected by way of the field bus to the electronic circuitry in the upper housing compartment 1. The electronic circuitry in the upper housing compartment 1 is provided with a field-bus address that can be set by means of DIP switches, and filters out data that are intended for this specific address. Furthermore, it translates these data into a system-bus protocol and transfers the translated system-bus data by way of leads in the hybrid cable to at least one converter attached to the hybrid cable. Analogously, data are translated back to the field-bus protocol in the reverse order.

Additional converters or devices can be connected to this system bus and can also exchange data with one another. Here it is advantageous that the system bus can be designed for a very high data-transmission rate and hence is usable for special applications.

Figure 2:
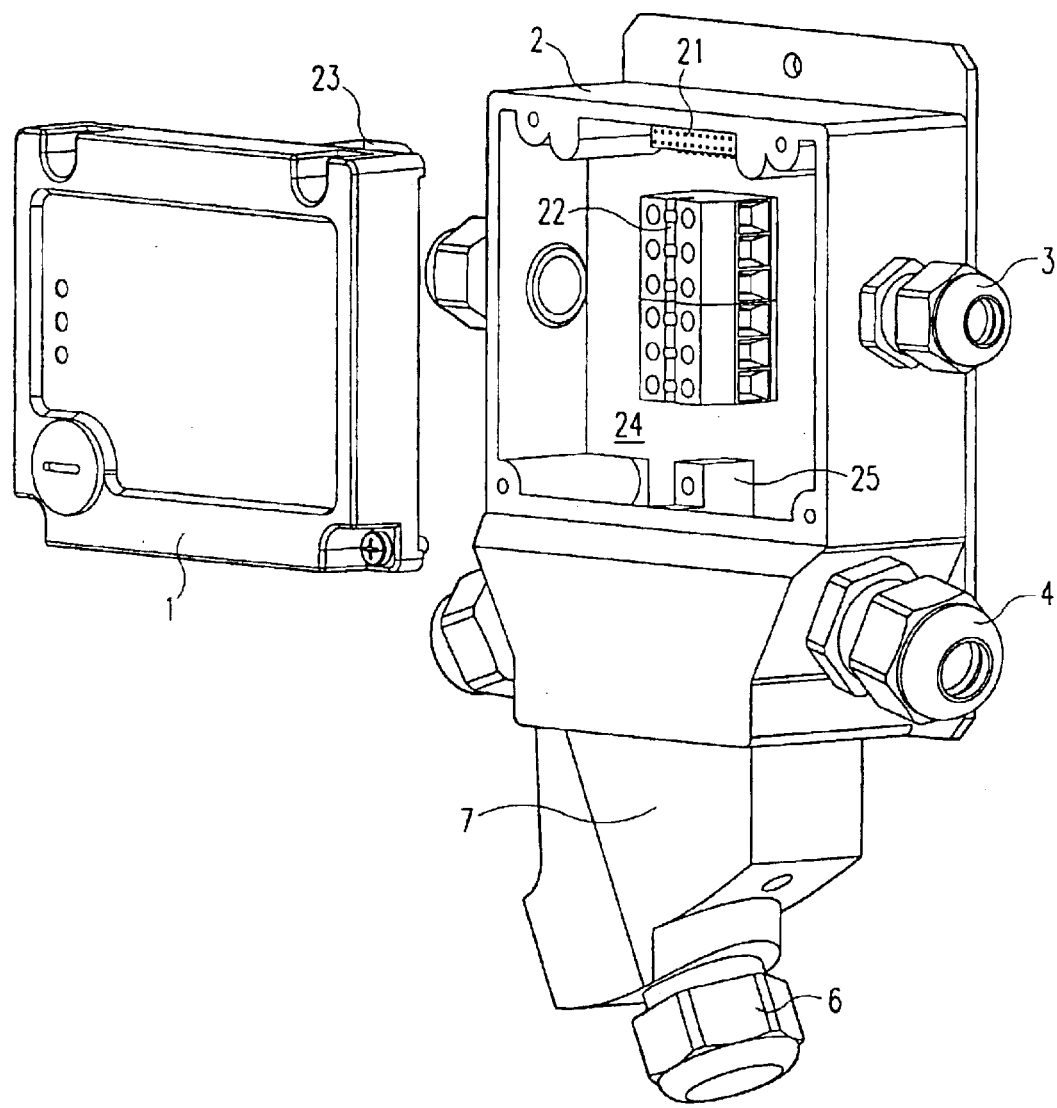
FIG. 2 is a perspective view of the first exemplary embodiment of the invention with an upper housing compartment lifted away.

FIG. 2 shows the same distributor box as FIG. 1 but with the upper housing compartment 1 lifted away to reveal the board 24 to which the above-mentioned hybrid pin-and-socket connector is soldered. On the board 24 are mounted additional external terminal arrangements 22, 25 by way of which to connect external leads such as field-bus leads, power-supply leads, high tension leads, shielding leads and neutral leads.

The first connector part 23 is mounted in the upper housing compartment 1 and is electrically connected to the electronic circuitry in the upper housing compartment 1. The second connector part 21 is set onto the board 24 and electrically connected thereto by soldering. The first connector part 23 and the second connector part 21 thus together form a transfer pin-and-socket connector, which apart from a grounding cable constitutes the only electrical connection between upper housing compartment 1 and lower housing compartment 2.

Figure 3:
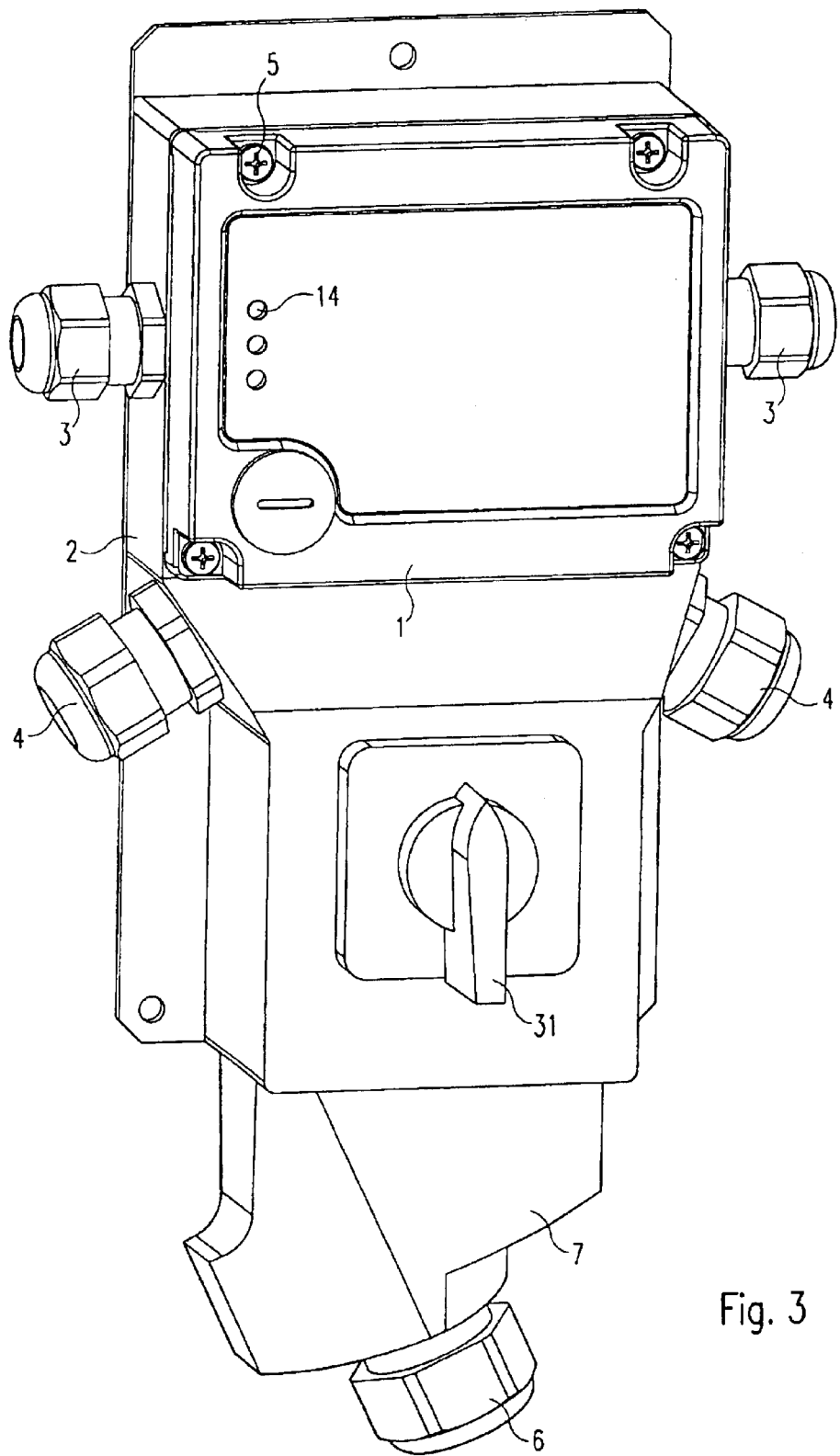
FIG. 3 is a perspective view of a second exemplary embodiment of the invention.

In FIG. 3 is shown an advantageous further development that comprises a motor-protection switch 31 for electrical disconnection of the high tension leads. This is connected to the lower housing compartment 2 and incorporates an auxiliary switch for electrical disconnection of the field-bus leads with power-supply leads. That is, here the auxiliary switch serves for the electrical disconnection of low tension leads. Hence during installation, assembly or repair work the whole hybrid cabling with connected field equipment, such as converters with electric motors or the like, can be electrically turned off.

Figure 4:
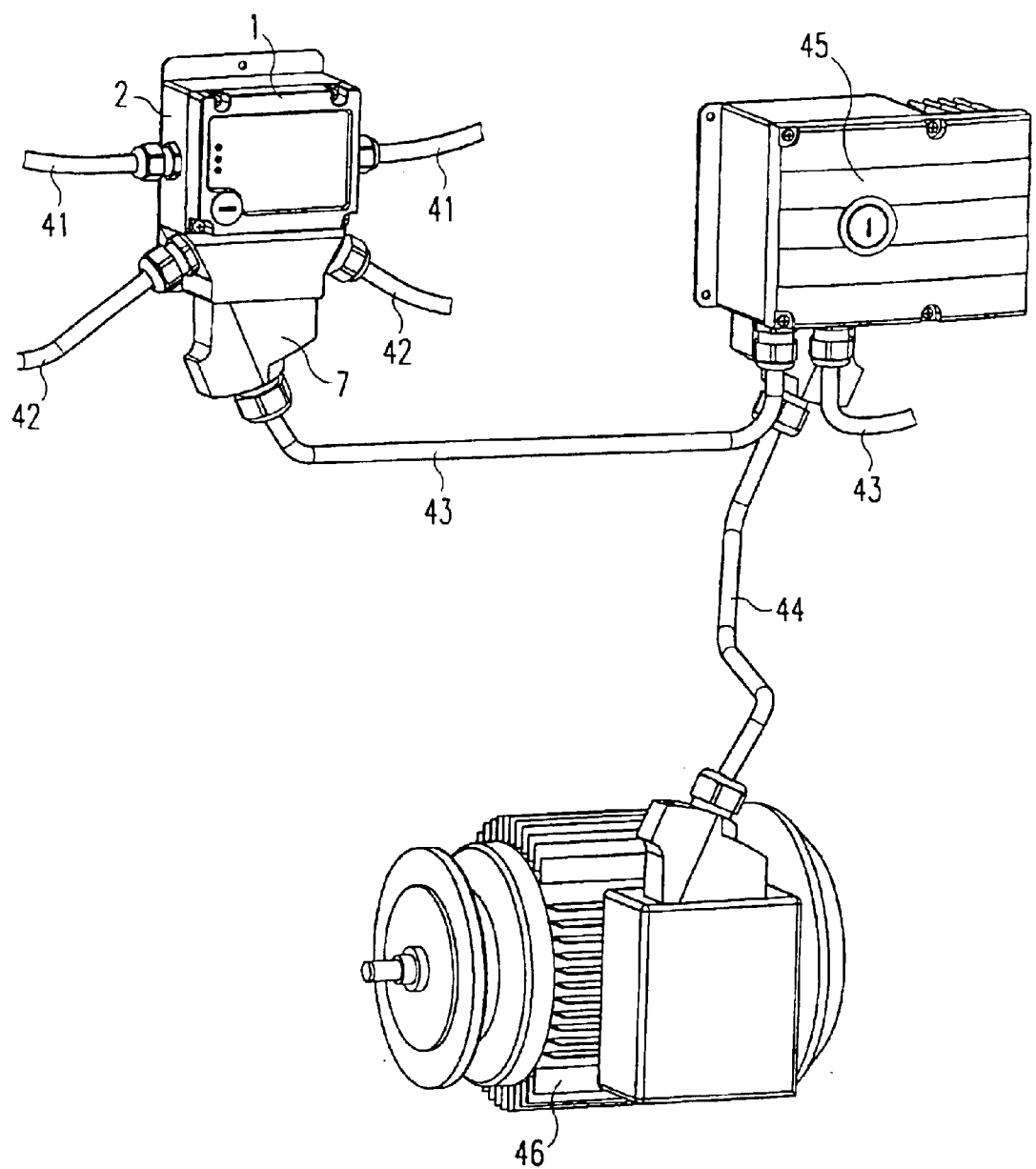
FIG. 4 is a perspective view of a cable arrangement for the first exemplary embodiment with separate converter and electric motor.

FIG. 4 shows how a field mechanism is connected to the distributor box in accordance with the invention as shown in FIGS. 1 and 2. The field-bus cable is electrically looped through the lower housing compartment 2, such that the electronic circuit in the upper housing compartment 1 taps the field bus and translates the data destined for the set address into a control-bus protocol. The high tension cables 42 are likewise looped through in a T shape, such that the high tension leads in the hybrid cable 43 are connected to the high tension cables 42. The hybrid cable 43 conducts high voltage and control bus output to the converter and is looped through the converter 45. Thus additional field mechanisms, such as the converter 45 with electric motors 46 or the like, can also be connected. The converter 45 delivers power to the electric motor 46 by way of the supply cable 44.

Figure 5:
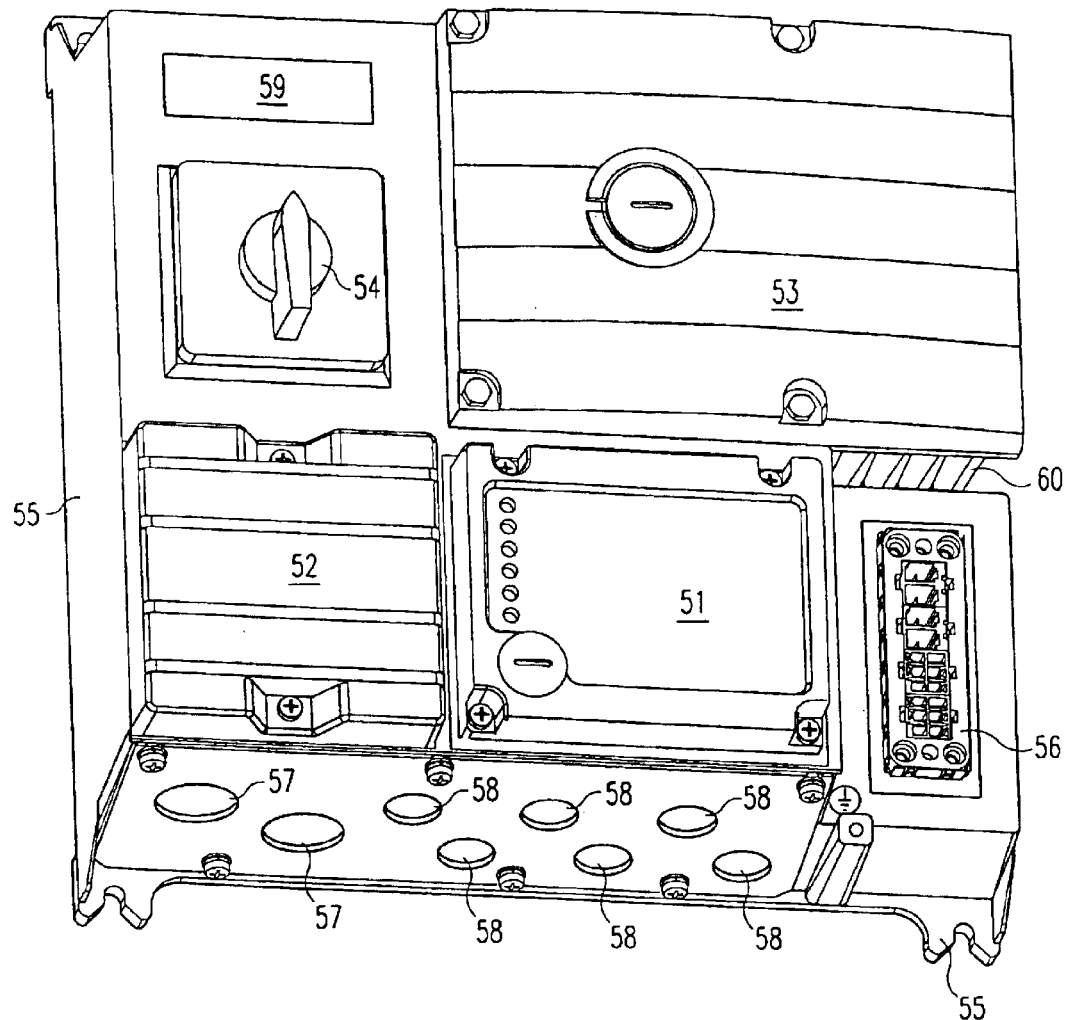
FIG. 5 is a perspective view of a third exemplary embodiment of the invention.
Figure 6:
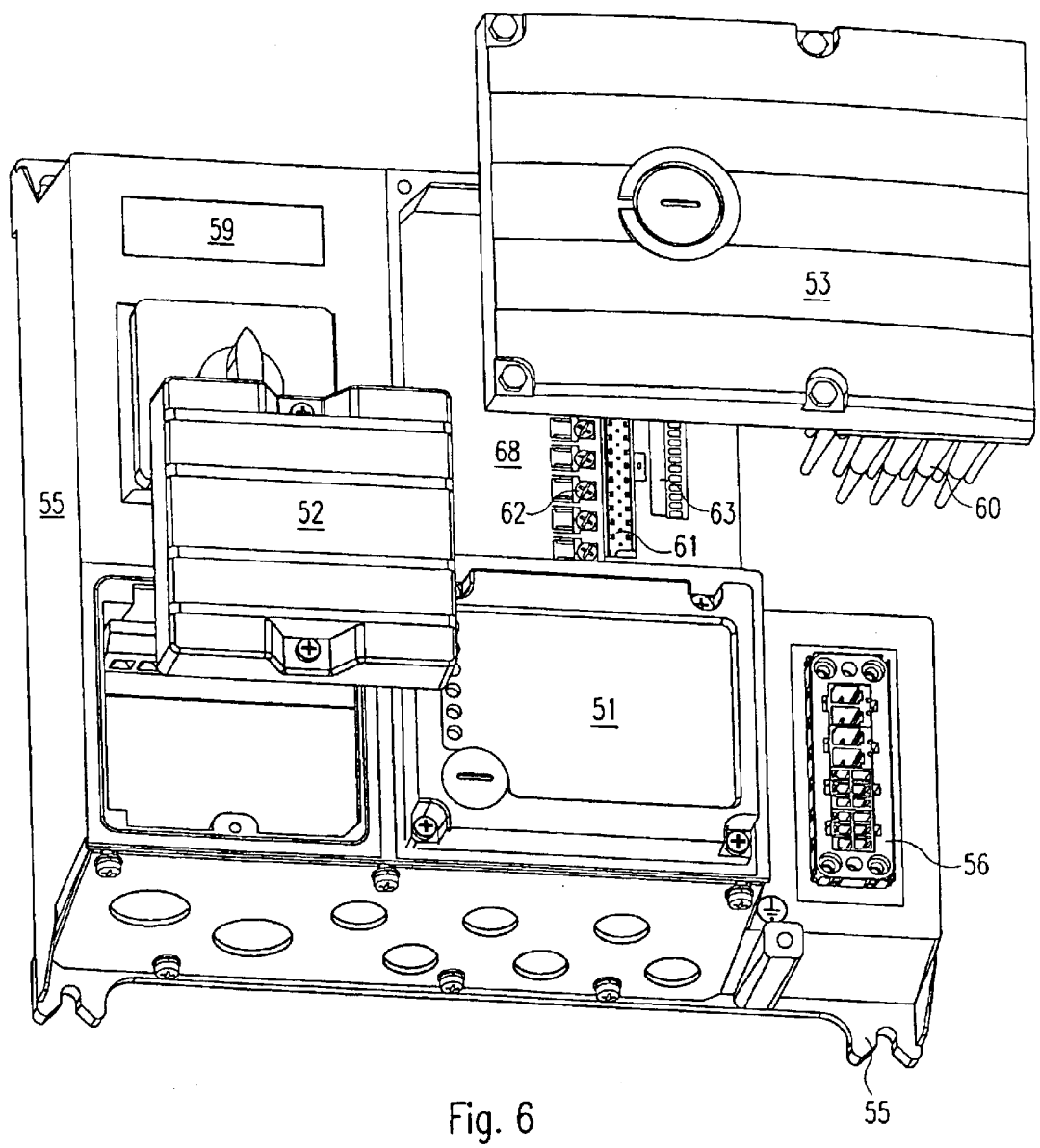
FIG. 6 is a perspective view of the third exemplary embodiment of the invention with an upper housing compartment lifted away.

In FIGS. 5 and 6 is shown another exemplary embodiment in accordance with the invention. It comprises a lower housing compartment 55, onto which several upper housing compartments 51, 52, 53 are set; these are releasably attached, by means of screws, to the lower housing compartment 55 so as to afford a high degree of protection. FIG. 5 shows the upper housing compartments 51, 52, 53 thus attached, whereas FIG. 6 shows the second and third upper housing compartments 52, 53 lifted away. In addition, an identification plate 59 and a motor-protection switch 54 are disposed on the lower housing compartment 55.

The lower housing compartment 55 comprises two large bores 57 for high tension leads and small bores 58 to receive PG screw fittings for field-bus leads. The high tension leads, like the field-bus leads, are looped through in a T configuration. During assembly, therefore, one of the high tension leads is passed through one of the large bores 57 as a supply line and is attached to a terminal strip that is seated on the board 68 of the lower housing compartment 55 and is connected to the board 68 by solder joints. Conversely, in the same way a high tension cable is passed through one of the large bores 57 as an outgoing line and is attached to the terminal strip. The three-phase current is therefore conducted from the supply line through the outgoing line to other devices. By way of the board 68, however, it is also possible to redirect three-phase current to the hybrid pin-and-socket connector part 56, which thus serves as an external terminal through which to supply an electric motor that is connected there.

The first upper housing compartment 51 comprises, as in FIGS. 1 and 2, an electronic circuit that is electrically connected to field-bus leads and filters out from the field-bus data stream the particular data that are destined for the address set by means of DIP switches. These data are then translated into the system-bus protocol and conducted through the system bus to a converter attached thereto. In FIGS. 5 and 6 the converter is constructed as a third upper housing compartment 53, which contains the appropriate electronic circuit with electronic connectors, the heat of which is conducted away by the cooling device 60. The electrical connections to the lower housing compartment are provided by a pin-and-socket connector with second connector part 61. The connector devices 62 are used to connect the motor-protection switch 54. The pin-and-socket connector 63 provides a connection to the hybrid pin-and-socket connector part 56, in such a way that at least the high tension leads, leads to supply the brake of the motor (i.e., brake leads), and temperature-sensor leads and neutral leads are sent to the hybrid connector part 56.

Again there is coupled to the motor-protection switch 54 an auxiliary switch that operates substantially simultaneously with the motor-protection switch 54. That is, it serves for the electrical disconnection of low tension leads as well as of motor-control leads.

The hybrid pin-and-socket connector part 56 shown in FIGS. 5 and 6 comprises, on one hand, high tension cables for large currents and voltages. On the other hand, it comprises leads that can conduct only smaller currents, i.e. low tension currents, and also voltages. Therefore it is advantageous to employ a cable with leads of various diameters, in particular when hybrid connectors are used such as, for example, the hybrid pin-and-socket connector part 56, because by this means the labor of installation can be considerably reduced.

When the second upper housing compartment 52 is lifted away, the connector devices for incoming and outgoing conduction through high tension leads are accessible, just like those for the field-bus and other leads. These connector devices are also termed external terminal arrangements, because they serve for the connection of external leads.

In the lower housing compartment 55 a braking resistance is also mounted, which is electrically connected to the connector devices 62 and hence can be connected to the electronic circuit in the third upper housing compartment 53, which is constructed as an attachable converter.

List of Reference Numerals 1 upper housing compartment
2 lower housing compartment
3 PG screw fitting for field bus and supply voltages
4 PG screw fitting for high voltage
5 screws
6 PG screw fitting for hybrid cables
7 hybrid pin-and-socket connector part
14 display elements
21 second connector part
22 external terminal arrangements
23 first connector part
24 board
25 external terminal arrangements
31 motor-protection switch
41 field-bus cable
42 high tension cable
43 hybrid cable
44 power-supply cable
45 converter
46 electric motor
51 first upper housing component
52 second upper housing component
53 third upper housing component
54 motor-protection switch
55 lower housing compartment
56 hybrid pin-and-socket connector part
57 large bores
58 small bores
59 identification plate
60 cooling device
61 second pin-and-socket connector part
62 connector devices
63 pin-and-socket connector
68 board

What is claimed is:

1. A distributor box comprising:
   (a) a lower housing compartment, said lower housing including a first connecting device, a second connecting device, a hybrid pin-and-socket connector part adapted to connect to both high tension and low tension leads of an external cable, a first T-shaped internal cabling that is adapted to connect together said first connecting device, said second connecting device, and said hybrid pin-and-socket connector part;
   (b) an upper housing compartment adapted to mate with the lower housing compartment, said upper housing compartment includes an electronic circuit adapted to communicate with an external control bus;
   (c) a transfer pin-and-socket connector, said pin-and-socket connector including a first connector part fixedly mounted within the upper housing compartment, a second connector part fixedly mounted within said lower housing compartment, wherein said first connector part and said second connector part are adapted to electrically connect when said upper housing compartment and said lower housing compartment are mated together, said second connector part is adapted to electrically connect to an external cable via said connecting devices, said first connector part of said pin-and-socket connector is adapted to electrically connect to said electronic circuit; and
   (d) said lower housing further including a second T-shaped internal cabling adapted to connect together said first connecting device, said second connecting device, and said second pin and socket connector.

2. The distributor box according to claim 1, wherein the hybrid pin-and-socket connector part is adapted to connect to a low tension brake lead.

3. The distributor box according to claim 1, wherein the hybrid pin-and-socket connector part is adapted to connect to a low tension control-bus lead.

4. The distributor box according to claim 1, wherein the electric circuit is adapted to connect to a field bus and a system bus.

5. The distributor box according to claim 1, further comprising a second upper housing compartment that defines a closed spatial region.

6. The distributor box according to claim 1, further comprising a third upper housing compartment that comprises a electric circuit that is adapted to connect to a system bus lead and a brake lead.

7. The distributor box according to claim 6, wherein the lower housing compartment comprises a braking resistance, said braking resistance is adapted to connect to said electric circuit in said third upper housing compartment.

8. The distributor box according to claim 1, wherein said transfer pin-and-socket connector is the only electrical connection between said upper housing compartment and said lower housing compartment.

9. The distributor box according to claim 1, wherein the said transfer pin-and-socket connector and a ground connection cable are the only electrical connections between said upper housing compartment and said lower housing compartment.

10. The distributor box according to claim 1, wherein said lower housing is adapted to connect to a field-bus lead and a control-bus lead that include leads for supply voltages.

11. The distributor box according to claim 1, wherein said lower housing comprises a motor-protection switch for disconnecting a high tension lead.

12. The distributor box according to claim 1, wherein said lower housing comprises a auxiliary switch for disconnecting a low tension lead.

13. The distributor box according to claim 1, wherein said electronic circuit is addressable as a bus participant and can filter field bus data and translate said data into a control-bus protocol and send said translated data by way of a control bus to a field mechanism supplied from said distributor box.

14. The distributor box according to claim 1, wherein said electronic circuit comprises a settable switch with which to a set field-bus addresses.

15. The distributor box according to claim 1, wherein said upper housing compartment comprises a connector devices adapted to connect an external sensors or an actuator.

16. The distributor box according to claim 1, wherein said upper housing compartment comprises a connector device for a control unit.

17. The distributor box according to claim 1, wherein said upper housing compartment comprises a display device.

18. The distributor box according to claim 1, wherein said upper housing compartment comprises a control element such as a key, a push-button, a rotating knob for input and controlling processes.

19. A distributor box comprising:
   (a) a lower housing compartment, said lower housing including a connecting device;
   (b) an upper housing compartment adapted to mate with said lower housing compartment, said upper housing compartment includes an electronic circuit;
   (c) a transfer pin-and-socket connector, said pin-and-socket connector including a first connector part fixedly mounted within the upper housing compartment, a second connector part fixedly mounted within said lower housing compartment, wherein said first connector part and said second connector part are adapted to electrically connect when said upper housing compartment and said lower housing compartment are mated together, said second connector part is adapted to electrically connect to an external cable via said connecting devices, said first connector part of said pin-and-socket connector is adapted to electrically connect to said electronic circuit; and
   (d) a braking resistance mounted in thermal conduction with said lower or said upper housing.

20. The distributor box according to claim 19, wherein said braking resistance is mounted to the interior of said lower or upper housing.

21. The distributor box according to claim 19, wherein said lower housing comprises cooling fingers or cooling ribs.

22. A distributor box comprising:
   (a) a lower housing compartment, said lower housing including a connecting device,
   (b) an first upper housing compartment adapted to mate with said lower housing compartment, said upper housing compartment includes an electronic circuit;
   (c) a transfer pin-and-socket connector, said pin-and-socket connector including a first connector part fixedly mounted within the upper housing compartment, a second connector part fixedly mounted within said lower housing compartment, wherein said first connector part and said second connector part are adapted to electrically connect when said upper housing compartment and said lower housing compartment are mated together, said second connector part is adapted to electrically connect to an external cable via said connecting device, said first connector part of said pin-and-socket connector is adapted to electrically connect to said electronic circuit; and,
   (d) a second upper housing compartment, wherein said second upper housing compartment closes off said lower housing compartment from the surroundings.

23. The distributor box according to claim 22, wherein removal of said second upper housing compartment allows direct access to said connecting devices located in the lower housing.

* * * * *